US012021521B2

(12) United States Patent
Wang

(10) Patent No.: US 12,021,521 B2
(45) Date of Patent: Jun. 25, 2024

(54) TOUCH CONTROL DISPLAY SUBSTRATE, TOUCH CONTROL DISPLAY PANEL, AND TOUCH CONTROL DISPLAY DEVICE

(71) Applicant: Wuhan China Star Optoelectronics Technology Co., Ltd., Hubei (CN)

(72) Inventor: Lifang Wang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 543 days.

(21) Appl. No.: 17/281,612

(22) PCT Filed: Mar. 19, 2021

(86) PCT No.: PCT/CN2021/081877
§ 371 (c)(1),
(2) Date: Mar. 31, 2021

(87) PCT Pub. No.: WO2022/188201
PCT Pub. Date: Sep. 15, 2022

(65) Prior Publication Data
US 2023/0127878 A1    Apr. 27, 2023

(30) Foreign Application Priority Data
Mar. 10, 2021  (CN) .......................... 202110259570.2

(51) Int. Cl.
*H03K 17/96*   (2006.01)
*G06F 3/041*   (2006.01)
*G06F 3/044*   (2006.01)

(52) U.S. Cl.
CPC ..... *H03K 17/9622* (2013.01); *G06F 3/04164* (2019.05); *G06F 3/0443* (2019.05)

(58) Field of Classification Search
CPC ........ H01H 2209/00; H01H 2209/024; H01H 2209/038; H01H 2209/074; H01H 2221/00; H01H 2221/002; H01H 2239/00; H01H 2239/006; H01H 2239/01; H01H 2239/074; H01H 2211/024; H01H 13/00; H01H 13/702; H01H 13/704; H01H 2207/00;
(Continued)

(56) References Cited

U.S. PATENT DOCUMENTS

| 8,059,015 B2 * | 11/2011 | Hua ..................... G06F 3/04886 |
| | | 178/18.05 |
| 2013/0050130 A1 | 2/2013 | Brown |
| 2017/0228074 A1 * | 8/2017 | Du ......................... G06F 3/0412 |

FOREIGN PATENT DOCUMENTS

| CN | 101840286 | 9/2010 |
| CN | 105549792 | 5/2016 |

(Continued)

*Primary Examiner* — Anthony R Jimenez

(57) ABSTRACT

A touch control display substrate, a touch control display panel, and a touch control display device are provided. The touch control display substrate includes a substrate, a plurality of touch control electrode blocks, a plurality of first touch control switches, a plurality of compensation switches, a plurality of first signal lines, and a plurality of compensation signal lines. Each of the compensation signal lines is connected to one of the compensation switches and one of the touch control electrode blocks. Each of the touch control signal blocks is connected to the first touch control switches by the first signal lines, and is connected to the compensation switches by the compensation signal lines.

20 Claims, 3 Drawing Sheets

(58) Field of Classification Search
CPC ......... H01H 2207/004; H01H 2207/01; H01H 2207/012; H01H 2207/014; H01H 2207/016; H01H 2207/024; H01H 2207/04; G06F 3/04164; G06F 3/0443; G06F 3/041; G06F 3/044; H03K 17/9622; H03K 17/96
See application file for complete search history.

(56) References Cited

FOREIGN PATENT DOCUMENTS

| | | |
|---|---|---|
| CN | 106095186 | 11/2016 |
| CN | 109085942 | 12/2018 |

* cited by examiner

TOUCH CONTROL DISPLAY SUBSTRATE, TOUCH CONTROL DISPLAY PANEL, AND TOUCH CONTROL DISPLAY DEVICE

RELATED APPLICATIONS

This application is a National Phase of PCT Patent Application No. PCT/CN2021/081877 having International filing date of Mar. 19, 2021, which claims the benefit of priority of Chinese Patent Application No. 202110259570.2 filed on Mar. 10, 2021. The contents of the above applications are all incorporated by reference as if fully set forth herein in their entirety.

FIELD AND BACKGROUND OF THE INVENTION

The present disclosure relates to the field of touch control display technologies, and more particularly, to a touch control display substrate, a touch control display panel, and a touch control display device.

With rapid development of display technologies, touch screen panels have become popularized in people's lives. Nowadays, in-cell touch panels, which have a common electrode of a touch screen embedded in a liquid crystal screen to reduce a thickness of an entire module and increase transmittance, attract attention from panel manufactures. In in-cell self-capacitive-type touch panels, a common electrode is divided into multiple areas that are time-division-multiplexed to provide a display voltage (Vcom) during a display period and provide a touch control voltage during a non-display period.

Regarding arrangements of conventional in-cell self-capacitive-type touch panels, an anode is positioned on an uppermost side of an entire structure. The anode is patterned to form a touch control electrode by divide and multiplex, and the touch control electrode is connected to a touch control signal by areas surrounding thereof. Regarding self-capacitive-type touch designs, a common electrode layer of a panel is divided into multiple blocks. During a display stage, the panel keeps switching between a common electrode signal and a scan signal due to touch, thereby integrating a display function and a touch control function.

However, since the common electrode layer is divided into hundreds of blocks having same sizes and each of the blocks is individually connected to a touch control signal line, a display panel is affected by RC loading during a touch scan. As such, a touch control signal line in a remote area would be relatively long and resistance would be relatively large, leading to relatively high loading of the touch control line in the remote area. On the contrary, a touch control signal line in a nearby area would be relatively short and resistance would be relatively small, leading to relatively low loading of the touch control line in the nearby area. In summary, a signal would gradually decrease from the nearby area to the remote area. Some manufacturing processes and panel sizes would attribute to a relatively high loading difference between a remote area and a nearby area. In panels with relatively large loading, a loading difference between a remote area and a nearby area is even more than 20%. If a driver cannot compensate for the loading difference, quality of products would be bad, leading to occurrence of flicker.

SUMMARY OF THE INVENTION

Embodiments of the present disclosure provide a touch control display substrate, a touch control display panel, and a touch control display device to solve a following issue: in conventional touch control display panels, feedthrough voltages between common electrodes far apart from each other are different, leading to different uniformity of flicker and a problem of afterimage.

The present disclosure provides a touch control display substrate, including:
a substrate provided with a display area;
a plurality of touch control electrode blocks disposed in an array manner in the display area;
a plurality of first touch control switches disposed on the substrate along a first direction;
a plurality of compensation switches disposed on the substrate along a second direction, wherein the first direction intersects the second direction, and the first touch control switches and the compensation switches are disposed on different sides of the touch control electrode blocks;
a plurality of first signal lines, wherein each of the first signal lines is connected to one of the first touch control switches and one of the touch control electrode blocks; and
a plurality of compensation signal lines, wherein each of the compensation signal lines is connected to one of the compensation switches and one of the touch control electrode blocks;
each of the touch control electrode blocks is connected to the first touch control switches by the first signal lines, and is connected to the compensation switches by the compensation signal lines.

In the touch control display substrate provided by the present disclosure, the compensation switches include a plurality of second touch control switches, and the compensation signal lines include a plurality of second signal lines;
the second touch control switches are disposed on a same side of the display area, and each of the second signal lines is connected to one of the second touch control switches and one of the touch control electrode blocks.

In the touch control display substrate provided by the present disclosure, the compensation switches further include a plurality of third touch control switches, and the compensation signal lines further include a plurality of third signal lines;
the third touch control switches are disposed on the substrate along the second direction, and the second touch control switches and the third touch control switches are respectively disposed on two opposite sides of the display area; and
each of the third signal lines is connected to one of the third touch control switches and one of the touch control electrode blocks.

In the touch control display substrate provided by the present disclosure, each of the touch control electrode blocks is connected to one of the first signal lines and one of the second signal lines; or each of the touch control electrode blocks is connected to one of the first signal lines and one of the third signal lines.

The touch control display substrate further includes:
a plurality of first through-holes defined on the touch control electrode blocks connected to the first signal lines, wherein the first signal lines are correspondingly and electrically connected to the corresponding touch control electrode blocks by the first through-holes; and
a plurality of second through-holes defined on the touch control electrode blocks connected to the second signal lines, wherein the second signal lines are correspondingly and electrically connected to the touch control electrode blocks by the second through-holes.

The touch control display substrate further includes:

a plurality of first through-holes defined on the touch control electrode blocks connected to the first signal lines, wherein the first signal lines are correspondingly and electrically connected to the corresponding touch control electrode blocks by the first through-holes; and a plurality of second through-holes defined on the touch control electrode blocks connected to the second signal lines, wherein the second signal lines are correspondingly and electrically connected to the touch control electrode blocks by the second through-holes.

The touch control display substrate further includes:

a plurality of third through-holes defined on the touch control electrode blocks connected to the third signal lines, wherein the third signal lines are correspondingly and electrically connected to the touch control electrode blocks by the third through-holes.

In the touch control display substrate provided by the present disclosure, the first touch control switches are spaced apart from each other along the first direction, and the compensation switches are spaced apart from each other along the second direction.

In the touch control display substrate provided by the present disclosure, each of the first signal lines extends along the second direction and penetrates an entire column of the touch control electrode blocks, and the first signal lines are spaced apart from each other along the first direction; and each of the second signal lines extends along the first direction and penetrates at least one of the touch control electrode blocks in a same row, and the second signal lines are spaced apart from each other along the second direction.

In the touch control display substrate provided by the present disclosure, the third signal lines corresponding to the second signal lines extend along the first direction and penetrate other touch control electrode blocks in the same row, and the third signal lines are spaced apart from each other along the second direction.

In the touch control display substrate provided by the present disclosure, in the touch control electrode blocks in a same row, the touch control electrode blocks are correspondingly connected to the second touch control switches by the second signal lines when a first distance is greater than a second distance; and the touch control electrode blocks are correspondingly connected to the third touch control switches by the third signal lines when the second distance is greater than the first distance;

wherein the first distance is from the touch control electrode blocks to the second touch control switches along the first direction, and the second distance is from the touch control electrode blocks to the third touch control switches along the first direction.

The touch control display substrate further includes:

a first metal layer disposed on the substrate, wherein the second signal lines are disposed in the first metal layer;

a second metal layer disposed on the first metal layer, wherein at least part of the second metal layer is conductive to the first metal layer;

a first insulating layer disposed on the second metal layer, wherein the second through-holes are defined on the first insulating layer; and a touch control electrode layer disposed on the first insulating layer, wherein the touch control electrode blocks are disposed in the touch control electrode layer, and the second metal layer is connected to one of the touch control electrode blocks by the second through-holes.

The touch control display substrate further includes:

a third metal layer disposed below the touch control electrode layer, wherein the first signal lines are disposed in the third metal layer; and a second insulating layer disposed between the second metal layer and the third metal layer.

The touch control display substrate further includes:

an active layer disposed on the substrate;

a gate layer disposed on the active layer, wherein the gate layer and the first metal layer are disposed on a same layer; and a source/drain electrode layer disposed on the gate layer, wherein the source/drain electrode layer and the second metal layer are disposed on a same layer, and the source/drain electrode layer is connected to the active layer.

The touch control display substrate further includes:

a passivation layer disposed on the touch control electrode layer; and a pixel electrode layer disposed on the passivation layer, wherein the pixel electrode layer is partly connected to the source/drain electrode layer.

In the touch control display substrate provided by the present disclosure, a working stage of the touch control display substrate includes a display stage and a touch control stage, and the touch control electrode blocks are multiplexed as a common electrode in the display stage.

The present disclosure further provides a touch control display panel, including a color filter substrate, a liquid crystal layer, and a touch control display substrate, wherein the liquid crystal layer is disposed between the color filter substrate and the touch control display substrate.

The touch control display substrate includes:

a substrate provided with a display area;

a plurality of touch control electrode blocks disposed in an array manner in the display area;

a plurality of first touch control switches disposed on the substrate along a first direction;

a plurality of compensation switches disposed on the substrate along a second direction, wherein the first direction intersects the second direction, and the first touch control switches and the compensation switches are disposed on different sides of the touch control electrode blocks;

a plurality of first signal lines, wherein each of the first signal lines is connected to one of the first touch control switches and one of the touch control electrode blocks; and a plurality of compensation signal lines, wherein each of the compensation signal lines is connected to one of the compensation switches and one of the touch control electrode blocks;

each of the touch control electrode blocks is connected to the first touch control switches by the first signal lines, and is connected to the compensation switches by the compensation signal lines.

In the touch control display panel provided by the present disclosure, the compensation switches include a plurality of second touch control switches, and the compensation signal lines include a plurality of second signal lines;

the second touch control switches are disposed on a same side of the display area, and each of the second signal lines is connected to one of the second touch control switches and one of the touch control electrode blocks.

In the touch control display panel provided by the present disclosure, the compensation switches further include a plurality of third touch control switches, and the compensation signal lines further include a plurality of third signal lines;

the third touch control switches are disposed on the substrate along the second direction, and the second touch control switches and the third touch control switches are respectively disposed on two opposite sides of the display area; and each of the third signal lines is connected to one of the third touch control switches and one of the touch control electrode blocks.

The present disclosure further provides a touch control display device, including the touch control display panel.

Regarding beneficial effects: in a touch control display substrate, a touch control display panel, and a touch control display device provided by the present disclosure, a first touch control switch is provided, and a compensation switch is disposed on an intersection between a first direction and a second direction. The first touch control switch and the compensation switch are disposed on different sides of a touch control electrode block. The compensation switch is correspondingly connected to a touch control electrode by a compensation signal line, thereby reducing a distance between a signal line of the touch control switch and a corresponding touch control electrode. The compensation switch and the compensation signal line solve problems of high RC loading and high resistance of a first signal line having relatively great length caused by multiple first signal lines having uneven lengths in each column of the touch electrode blocks. Therefore, RC loading of signal lines can be reduced, which effectively improves common voltage uniformity of the touch control electrode blocks and further enhances display quality of the display panel.

BRIEF DESCRIPTION OF THE SEVERAL VIEWS OF THE DRAWINGS

Technical solutions and beneficial effects of the present disclosure are illustrated below in detail in conjunction with drawings and specific embodiments.

DESCRIPTION OF SPECIFIC EMBODIMENTS OF THE INVENTION

Figure 1:
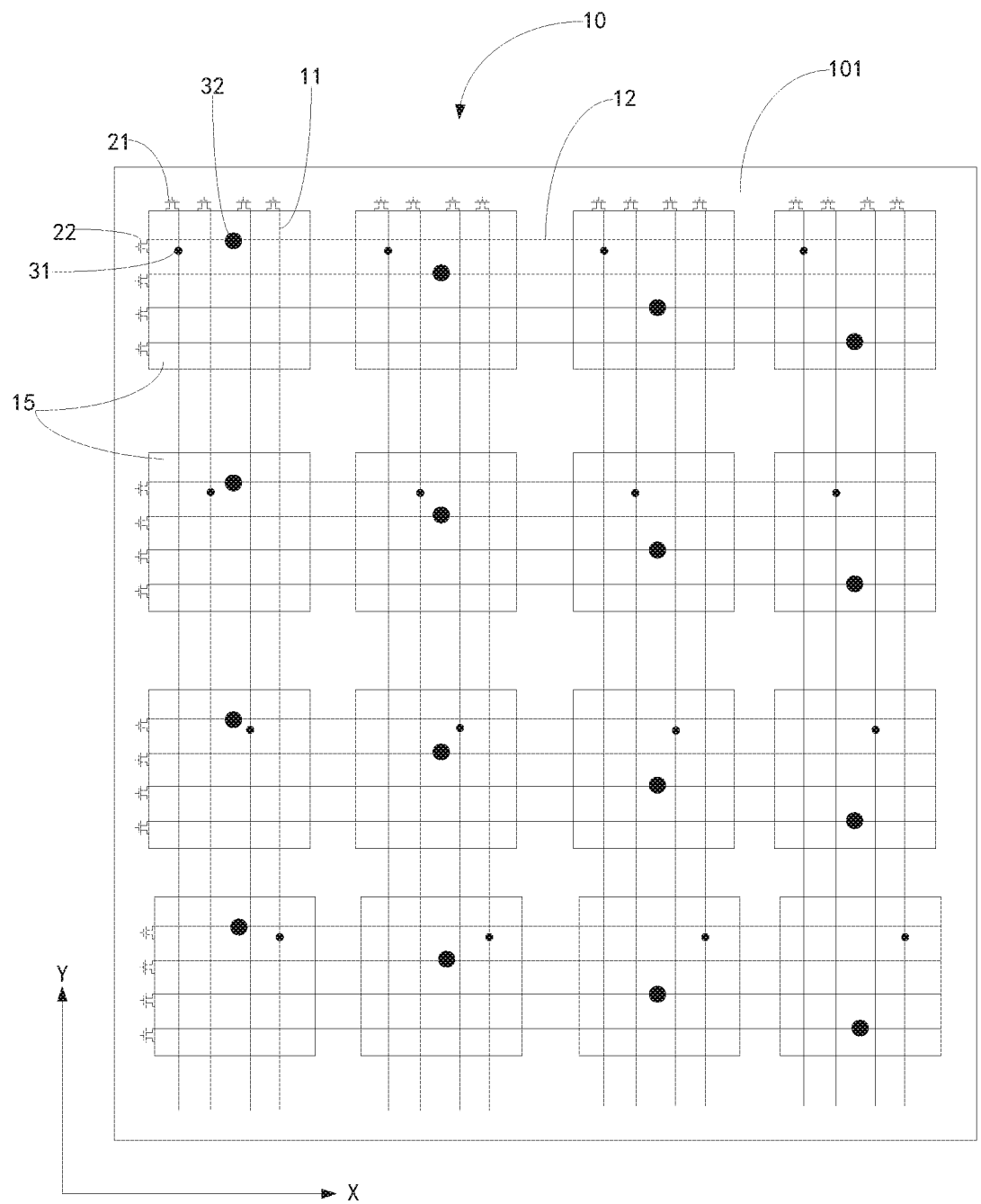
FIG. 1 is a structural schematic view showing a touch control display substrate according to one embodiment of the present disclosure.

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure below provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure.

Such repetitions are for simplification and clearness, which per se do not indicate the relations of the discussed embodiments and/or settings.

Moreover, the present disclosure provides examples of various specific processes and materials, but the applicability of other processes and/or application of other materials may be appreciated by a person skilled in the art.

In one aspect, the present disclosure provides a touch control display panel, including a color filter substrate, a liquid crystal layer, and a touch control display substrate. The liquid crystal layer is disposed between the color filter substrate and the touch control display substrate.

An embodiment of the present disclosure provides a touch control display substrate, as shown in FIG. 1, including: a substrate 10, a plurality of touch control electrode blocks 15, a plurality of touch control switches 21, a plurality of compensation switches 22, a plurality of first signal lines 11, and a plurality of compensation signal lines 12.

The substrate 10 is provided with a display area 101 and is configured to support elements such as the touch control electrode blocks 15, the first touch control switches 21, the compensation switches 22, the first signal lines 11, and the compensation signal lines 12. The substrate 10 may be a rigid substrate such as a glass substrate. Alternatively, the substrate 10 may be a flexible substrate such as a polyimide substrate.

The touch control electrode blocks 15 are disposed in an array manner in the display area 101. The touch control electrode blocks are generally made of metal. Adjacent touch control electrode blocks 15 may be spaced apart from each other, thereby preventing interference from occurring between different touch control sensing areas. In the present embodiment, the touch control electrode blocks 15 may be a plurality of rectangular blocks arranged in a rectangular array manner.

It should be noted that a shape and an arrangement of the touch control electrode blocks 15 demonstrated in the present embodiment are only examples. It should be understood that the shape and arrangement of the touch control electrode blocks 15 are not limited by the above description, and may be any shape of arrangement as long as short circuiting would not occur between adjacent touch control electrode blocks 15.

As shown in FIG. 1, the first touch control switches 21 are disposed on the substrate 10 along a first direction X, and the compensation switches 22 are disposed along a second direction Y. Specifically, the first direction X is perpendicular to the second direction Y. The first direction X intersects the second direction Y. The first touch control switches 21 and the compensation switches 22 are disposed on different sides of the touch control electrode blocks 15. In the present embodiment, the first direction X is horizontal, and the second direction Y is vertical.

Each of the first signal lines 11 is connected to one of the first touch control switches 21 and one of the touch control electrode blocks 15. When one of the first signal lines 11 is connected to one of the touch control electrode blocks 15, it would not be connected to other touch control electrode blocks when penetrating them. This structure can prevent a problem of short circuiting.

Each of the compensation signal lines 12 is connected to one of the compensation switches 22 and one of the touch control electrode blocks 15. When each of the compensation signal lines 12 is connected to one of the touch control electrode blocks 15, it keeps extending to penetrate other touch control electrode blocks 15 but is not connected to other touch control electrode blocks 15. The touch control electrode blocks 15 having a touch control function are made of metal. Signal lines extend to penetrate other touch control electrode blocks, but are not connected to other touch control electrode blocks. This structure is beneficial for reducing a signal delay of other touch control electrode blocks caused by metal signal lines. Therefore, a display structure has better touch sensitivity.

Lengths of the first signal lines 11 corresponding to the touch control electrode blocks 15 in a same column are different. Specifically, the first signal lines 11 corresponding to the touch control electrode blocks 15 away from the first touch control switches 21 are relatively long, and resistance of the first signal lines 11 having relatively long length is relatively high. The compensation switches are disposed on intersections between the first direction X and the second direction Y. The first touch control switches 21 and the compensation switches 22 are respectively disposed on different sides of the touch control electrode blocks 15. Each of the touch control electrode blocks 15 is connected to the first touch control switches 21 and the second compensation switches 22 at the same time. The first signal lines 11 corresponding to the touch control electrode blocks 15 away from the first touch control switches 21 are relatively long. The compensation switches 22 are disposed on another side of the touch control electrode blocks 15. Therefore, a distance between the compensation switches 22 and the touch control electrode blocks 15 is less than a distance between the first touch control switches 21 and the touch control electrode blocks 15, and a distance between the touch control electrode blocks 15 and the compensation signal lines 12 is also less than a distance between the touch control electrode blocks 15 and the corresponding first signal lines 11. Thus, a problem of overly-high RC loading of the first signal lines 11 can be solved by the compensation switches 22 and the compensation signal lines 12. As a result, a problem of bad common electrode uniformity of the touch control electrode blocks 15 caused by overly-high RC loading of the first signal lines 11 can be prevented, thereby further preventing display effect of the touch control display panel from being affected.

In the touch control display substrate provided by the present embodiment, the first touch control switches are disposed along the first direction, and the compensation switches are disposed along the second direction and are correspondingly connected to touch control electrodes by the compensation signal lines. Therefore, a distance between the signal lines of the touch control switches and the corresponding touch control electrodes is reduced. The first signal lines 11 of the touch control electrode blocks 15 in each column have uneven lengths, and the first signal lines 11 having relatively long lengths encounter problems of high resistance and high RC loading. The compensation switches 22 and the compensation signal lines 12 solve the above problems. Therefore, RC loading of the signal lines can be effectively reduced, common electrode uniformity of the touch control electrode blocks can be effectively improved, and display quality of the display panel can be further enhanced.

In some embodiments, the compensation switches 22 include a plurality of second touch control switches 221, and the compensation signal lines 12 are plural. The second touch control switches 221 are disposed on a same side of the display area 101, and each of a plurality of second signal lines 121 is connected to one of the second touch control switches 221 and one of the touch control electrode blocks 15. The first signal lines 11 of the touch control electrode blocks 15 in each column have uneven lengths, and the first signal lines 11 having relatively long lengths encounter problems of high resistance and high RC loading. The second touch control switches 221 and the second signal lines 121 solve the above problems. Therefore, RC loading of the signal lines can be effectively reduced, common electrode uniformity of the touch control electrode blocks can be effectively improved, and display quality of the display panel can be further enhanced.

In some embodiments, the first touch control switches 21 are spaced apart from each other along the first direction X, and the second touch control switches 221 are spaced apart from each other along the second direction Y. Specifically, the touch control electrode blocks 15 are arranged along the first direction X to form multiple rows and are arranged to form multiple columns along the second direction Y. The first direction X is perpendicular to the second direction Y.

Optionally, the compensation signal lines 12 and the touch control electrode blocks 15 are disposed on different layers. The first signal lines 11, the second signal lines 121, and the touch control electrode blocks 15 are disposed on different layers.

In the present disclosure, the touch control switches can be disposed in many ways, and the touch control signal lines and the touch control electrode blocks can also be connected to each other in many ways, which are respectively illustrated below.

In some embodiments, each of the touch control electrode blocks 15 is connected to one of the first signal lines 11 and one of the second signal lines 121. That is, the touch control display substrate is provided with the first touch control switches 21 and the second touch control switches 221. Specifically, in some embodiment, the touch control display substrate provided by the present embodiment is provided with a plurality of first through-holes 31. The first through-holes 31 are defined on the touch control electrode blocks 15 connected to the first signal lines 11. The first signal lines 11 are electrically and correspondingly connected to the touch control electrode blocks 15 by the first through-holes 31. In the present embodiment, the touch control display substrate further includes a plurality of second through-holes 32 defined on the touch control electrode blocks 15 connected to the second signal lines 121. The second signal lines 121 are electrically and correspondingly connected to the touch control electrode blocks 15 by the second through-holes 32. In the present embodiment, the first through-holes 31 and the second through-holes 32 are configured as electrical connecting points between the signal lines and the touch control electrode blocks 15. The touch control signal lines are formed by an individual patterning process. Furthermore, the first through-holes 31 and the second through-holes 32 respectively allow the first signal lines 11 and the second signal lines 121 to be disposed on different layers from data lines. As such, an aperture of the touch control display device will not be affected.

In some embodiments, each of the first signal lines 11 extends along the second direction Y and penetrates an entire column of the touch control electrode blocks 15. The first signal lines 11 are spaced apart from each other along the first direction X. Each of the first signal lines 11 passes through the first through-holes 31 of an insulating material layer and is correspondingly and electrically connected to the touch control electrode blocks 15. That is, the touch control electrode blocks 15 and the first signal lines 11 have a one-to-one correspondence. Each of the second signal lines 121 extends along the first direction X and penetrates at least one of the touch control electrode blocks 15 in a same row, and the second signal lines 121 are spaced apart from each other along the second direction Y. Specifically, each of the second signal lines 121 may extend along the first direction X and penetrate an entire row of the touch control electrode blocks. Also, each of the second signal lines 121 may extend to a position where the second through-holes 32 are defined and does not penetrate other touch control electrode blocks in a same row. Each of the second signal lines 121 is electrically and correspondingly connected to the touch control electrode blocks 15 by the second through-holes 32 penetrating the insulating material layer. That is, the touch control electrode blocks 15 and the second signal lines 121 have a one-to-one correspondence.

Figure 2:
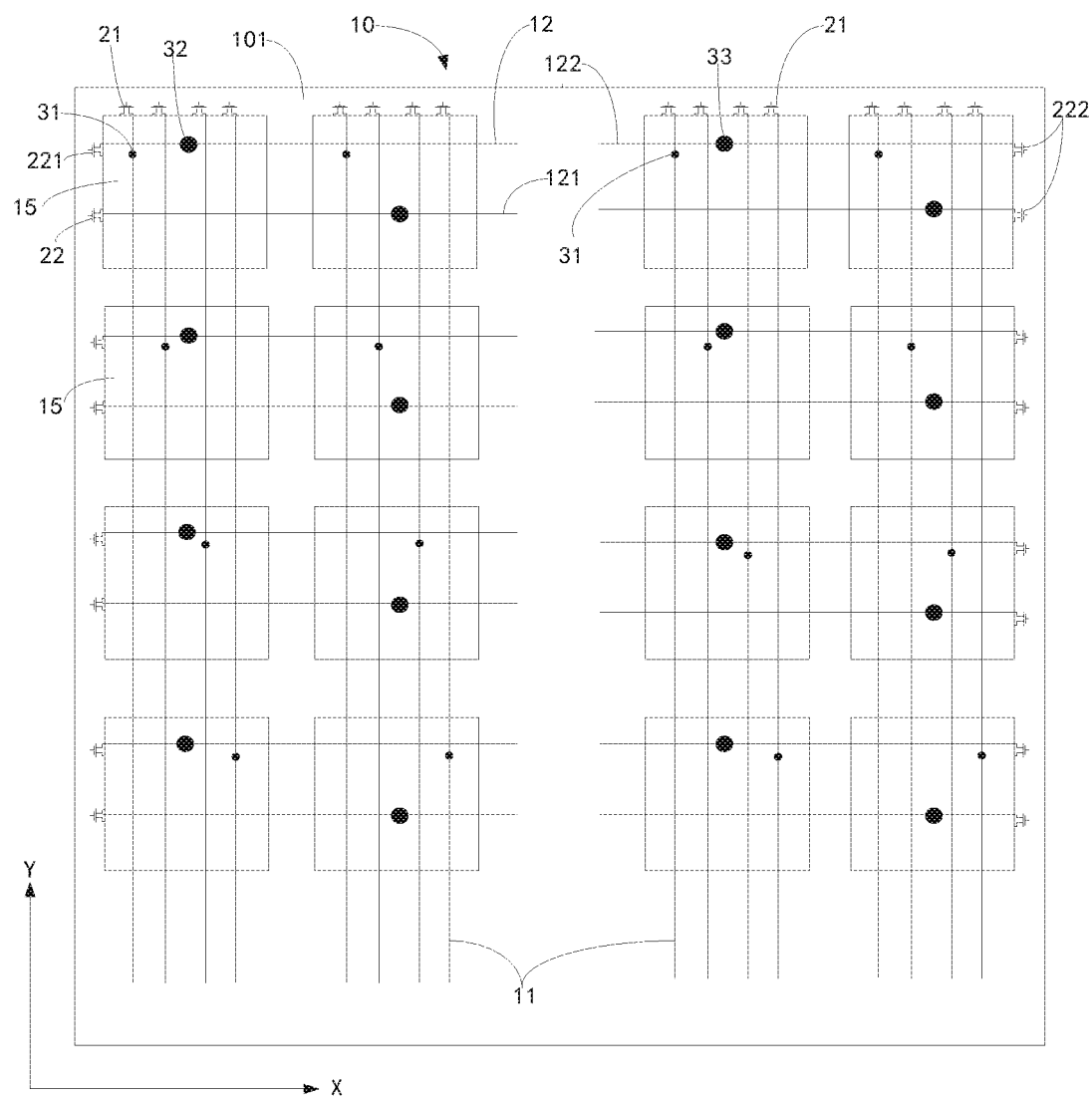
FIG. 2 is a structural schematic view showing a touch control display substrate according to another embodiment of the present disclosure.

In some embodiments, the compensation switches 22 further include a plurality of third touch control switches 222. Correspondingly, the compensation signal lines 12 further include a plurality of third signal lines 122. When the touch control display substrate is provided with the first touch control switches 21, the second touch control switches 221, and the third touch control switches 222 at the same time, each of the touch control electrode blocks 15 is connected to one of the first signal lines 11, one of the second signal lines 121, and one of the third signal lines 122. As shown in FIG. 2, in addition to the substrate 10, the touch control electrode blocks 15, the first touch control switches 21, the second touch control switches 221, the first signal lines 11, and the second signal lines 121, the touch control display substrate further includes the third touch control switches 222 and the third signal lines 122. The first touch control switches 21, the second touch control switches, and the third touch control switches 222 are thin-film transistors (TFTs).

Specifically, each of the touch control electrode blocks 15 includes the first through-hole 31, the second through-hole 32, and a third through-hole 33. The first signal lines 11 are electrically and correspondingly connected to the touch control electrode blocks 15 by the first through-holes 31. The second signal lines 121 are electrically and correspondingly connected to the touch control electrode blocks 15 by the second through-holes 32. The third through-holes 33 are defined on the touch control electrode blocks 15 connected to the third signal lines 122, and the third signal lines 122 are electrically and correspondingly connected to the touch control electrode blocks 15 by the third through-holes 33. In the present embodiment, the third signal lines 122 may further improve uniformity of touch control performance. In addition, the first through-holes 31, the second through-holes 32, and the third through-holes 33 are configured as electrical connecting points between the signal lines and the touch control electrode blocks 15. The touch control signal lines are formed by an individual patterning process. The first through-holes 31, the second through-holes 32, and the third through-holes 33 respectively allow the first signal lines 11, the second signal lines 121, and the third signal lines 122 to be disposed on different layers from data lines. As such, an aperture of the touch control display device will not be affected.

In each column of the touch control electrode blocks 15, each of the second signal lines 121 extends along the first direction X from left to right, and each of the third signal lines 122 extends along the first direction X from right to left. Embodiments of the present disclosure are not limited to the above arrangement. Each of the second signal lines 122 may also extend along the first direction X from right to left, and each of the third signal lines 122 may also extend along the first direction X from left to right.

The third touch control switches 222 are disposed on the substrate 10 along the second direction Y. The first touch control switches 21 and the second touch control switches 221 are respectively disposed on two opposite sides of the display area 101. The second touch control switches 221 and the third touch control switches 222 are respectively disposed on two opposite sides of the touch control electrode blocks 15 along the second direction Y. The second touch control switches 211 are disposed on a left side of the display area 101, and the third touch control switches 222 are disposed on a right side of the display area 101.

In the touch control display substrate provided by the present embodiment, the first touch control switches 21 are disposed along the first direction X, and the second touch control switches 221 and the third touch control switches 222 are disposed along the second direction Y. The second touch control switches 221 are correspondingly connected to touch electrodes by the second signal lines 121. The third touch control switches 222 are correspondingly connected to touch control electrodes by the third signal lines 122. The second touch control switches 221 and the third touch control switches 222 are respectively disposed on two opposite sides. The second touch control switches 221 control part of the touch control electrode blocks 15 in the first direction X. The third touch control switches 222 control other touch control electrode blocks 15 in the first direction X. Therefore, a length of the signal lines from the corresponding touch control switches to corresponding the touch control electrodes can be reduced. As a result, RC loading of the signal lines can be reduced, which effectively improves common voltage uniformity of the touch control electrode blocks and further enhances display quality of the display panel.

In some embodiments, each of the third signal lines 122 corresponding to the second signal lines 121 extends along the first direction X and penetrates other touch control electrode blocks in a same row. The third signal lines 122 are spaced apart from each other along the second direction Y.

In some embodiments, as shown in FIG. 2, in the touch control electrode blocks 15 in a same row, when a first distance is greater than a second distance, the touch control electrode blocks 15 are correspondingly connected to the second touch control switches 221 by the second signal lines 121. When the second distance is greater than the first distance, the touch control electrode blocks 15 are correspondingly connected to the third touch control switches 222 by the third signal lines 122. The first distance is from the touch control electrode blocks 15 to the second touch control switches 221 along the first direction X, and the second distance is from the touch control electrode blocks 15 to the third touch control switches 222 along the first direction X. In the present embodiment, an arrangement of the touch control switches and the touch control electrode blocks in a same row along the first direction is: the touch control electrode blocks 15, which are near one of two sides where the second touch control switches 221 or the third touch control switches 222 are disposed, are correspondingly connected to one of the two sides where the second touch control switches 221 or the third touch control switches 222 are disposed. By appropriately determining a connecting relationship between the second touch control switches and the touch control electrode blocks and a connecting relationship between the third touch control switches and the touch control electrode blocks, a length of the signal lines connected to the touch control electrode blocks can be controlled. Therefore, common voltage uniformity of the touch control electrode blocks can be further improved, and touch control performance can be further enhanced.

Figure 3:
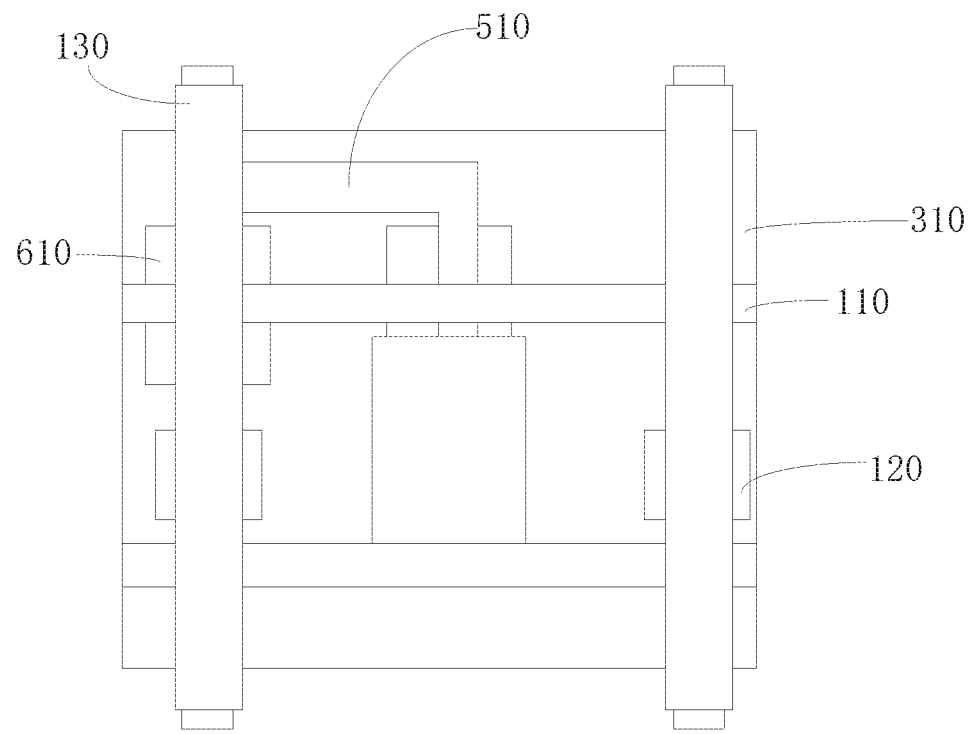
FIG. 3 is a top view showing layers of touch control electrode blocks of the touch control display substrate provided by the present disclosure.
Figure 4:
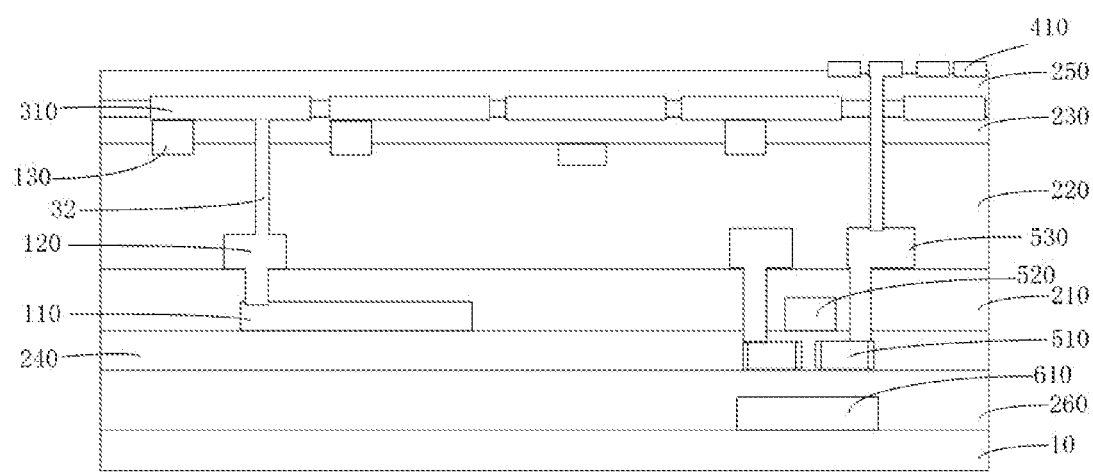
FIG. 4 is a sectional view showing the touch control display substrate provided by the present disclosure.

Also, the touch control display substrate provided by the present embodiment may only include the first touch control switches 21 and the third touch control switches 222. Wherein, the third touch control switches 222 are disposed opposite to the second touch control switches 221. Each of the touch control electrode blocks 15 is connected to one of the first signal lines 11 and one of the third signal lines 122. Each of the touch control electrode blocks 15 is only provided with the first through-hole 31 and the third through-hole 33. Wherein, the first signal lines 11 are electrically and correspondingly connected to the touch control electrode blocks 15 by the first through-holes 31. The third signal lines 122 are electrically and correspondingly connected to the touch control electrode blocks 15 by the third through-holes 33. As shown in FIG. 4 and FIG. 3, the touch control display substrate further includes a first metal layer 110, a second metal layer 120, a first insulating layer 210, and a touch control electrode layer 310.

Wherein, the first metal layer 110 is disposed on the substrate 10, and the second signal lines 121 are disposed in the first metal layer 110. The second metal layer 120 is disposed on the first metal layer 110, and at least part of the second metal layer 120 is conductive to the first metal layer 110. The first insulating layer 210 is disposed on the second metal layer 120, and the second through-holes 32 are defined on the first insulating layer 210. The touch control electrode layer 310 is disposed on the first insulating layer 210, the touch control electrode blocks are disposed in the touch control electrode layer 310, and the second metal layer 120 is connected to one of the touch control electrode blocks by the second through-holes 32.

The second signal lines 121 are compensation signal lines and are correspondingly connected to the touch control electrodes by the second through-holes 32. Therefore, a distance between the signal lines of the touch control switches and the corresponding touch control electrodes is reduced. The first signal lines 11 of the touch control electrode blocks 15 in each column have uneven lengths, and the first signal lines 11 having relatively long lengths encounter problems of high resistance and high RC loading. The compensation switches 22 and the compensation signal lines 12 solve the above problems. Therefore, RC loading of the signal lines can be effectively reduced, common electrode uniformity of the touch control electrode blocks can be effectively improved, and display quality of the display panel can be further enhanced.

Specifically, in some embodiments, the touch control display substrate further includes a third metal layer 130 and a second insulating layer 220.

The third metal layer 130 is disposed below the touch control electrode layer 310. Specifically, the third metal layer 130 is disposed on a side of the touch control electrode layer 310 toward the substrate 10. The first signal lines 11 are disposed in the third metal layer 130. The second insulating layer 220 is disposed between the second metal layer 120 and the third metal layer 130. The second insulating layer 220 is configured to insulate the second metal layer 120 from the third metal layer 130.

As shown in FIG. 4, the touch control display substrate further includes a third insulating layer 230 disposed on the second insulating layer 220. Specifically, the third insulating layer 230 is disposed on a side of the second insulating layer 220 away from the substrate 10. The third insulating layer 230 is configured to insulate the third metal layer 130 from the touch control electrode layer 310.

In some embodiments, the touch control display substrate further includes an active layer 510, a gate layer 520, and a source/drain electrode layer 530.

The active layer 510, the gate layer 520, and the source/drain electrode layer 530 are configured to form switch components such as a first touch control switch and a compensation switch.

The active layer 510 is disposed on the substrate 10. Specifically, the active layer 510 is disposed on a side of the substrate toward the first metal layer 110. The gate layer 520 is disposed on the active layer 510 and is disposed on a same layer as the first metal layer 110. A material of the gate layer 520 and a material of the first metal layer 100 are same. For example, the gate layer 520 and the first metal layer 110 are made of metal Mo. The source/drain electrode layer 530 is disposed on a side of the gate layer 520 away from the substrate 10 and is disposed on a same layer as the second metal layer 120. A material of the source/drain electrode layer 530 and a material of the second metal layer 120 are same. For example, the source/drain electrode layer 530 and the second metal layer 120 are made of Al/Ti/Al. Wherein, the source/drain electrode layer 530 is connected to the active layer 510.

As shown in FIG. 4, the touch control display substrate provided by the present embodiment further includes a light-shielding layer 610, a buffer layer 260, and a fourth insulating layer 240. The light-shielding layer 610 is disposed on the substrate 10. For example, the light-shielding layer 610 is disposed between the substrate 10 and the active layer 510. The buffer layer 260 is disposed on a side of the light-shielding layer 610 away from the substrate 10. The fourth insulating layer 240 is disposed between the active layer 510 and the gate layer 520, thereby insulating the active layer 510 from the gate layer 520.

It should be understood that the second touch control switches and the third touch control switches are disposed on two opposite sides of the touch control display substrate, and the second signal lines and the third signal lines are disposed on two opposite sides of the touch control display substrate. Therefore, layer structures and beneficial effects of the third signal lines and the third touch control switches are not described again here.

In some embodiments, a working stage of the touch control display panel includes a display stage and a touch control stage, and the touch control electrode blocks 15 are multiplexed as a common electrode in the display stage. Generally, the common electrode is made of a transparent conductive material. The touch control electrode blocks 15 are configured to receive a touch control signal voltage and a common voltage. When the touch control electrode blocks 15 are used to realize a touch control function, they are configured to receive a touch control signal voltage. When the touch control electrode blocks 15 are used as a common electrode, they are configured to receive a common electrode. The first signal lines 11, the second signal lines 121, and the third signal lines 122 are configured to electrically connect the touch control electrode blocks with each other.

Specifically, as shown in FIG. 4, the touch control display substrate further includes a passivation layer 250 and a pixel electrode layer 410.

The passivation layer 250 is disposed on the touch control electrode layer 310. Specifically, the passivation layer 250 is disposed on a side of the touch control electrode layer 310 away from the substrate 10. The passivation layer 250 is configured to insulate the touch control electrode layer 310 from the pixel electrode layer 410. The passivation layer 250 may be made of SiNx. The pixel electrode layer 410 is disposed on the passivation layer 250. Specifically, the pixel electrode layer 410 is disposed on a side of the passivation layer 250 away from the substrate 10. The pixel electrode layer 410 is configured to form pixel electrodes. The pixel electrode layer 410 is partly connected to the source/drain electrode layer 530.

The touch control electrode blocks 15 are multiplexed as a common electrode which can be obtained by modifying a common electrode layer of conventional liquid crystal display panels without adding additional layers. Therefore, manufacturing costs are reduced, producing efficiency is improved, and the display panel can be thinner and lighter.

Specifically, during the touch control stage of the touch control display panel, the touch control electrode blocks 15 are configured to generate a touch control signal and receive a sensing signal, thereby confirming a touch position. Meanwhile, the first signal lines 11, the second signal lines 121, and the third signal lines are not connected to a driving signal. During the display stage of the display panel, the touch control blocks 15 generate a VCOM voltage that is cooperated with signals transmitted by the first signal lines 11, the second signal lines 121, and the third signal lines 122, thereby allowing the display panel to display normally.

Furthermore, the prevent disclosure provides a touch control display device, including the display panel. The display device may be a mobile phone, a tablet, a television, a display, a laptop, a digital frame, a navigator, or other products with a display function.

In the above embodiments, the focus of each embodiment is different, and for a part that is not detailed in an embodiment, reference may be made to related descriptions of other embodiments.

A touch control display substrate, a touch control display panel, and a touch control display device have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A touch control display substrate, comprising:
   a substrate provided with a display area;
   a plurality of touch control electrode blocks disposed in array in the display area;
   a plurality of first touch control switches disposed on the substrate along a first direction;
   a plurality of compensation switches disposed on the substrate along a second direction, wherein the first direction intersects the second direction, and the first touch control switches and the compensation switches are disposed on different sides of the touch control electrode blocks;
   a plurality of first signal lines, wherein each of the first signal lines is connected to one of the first touch control switches and one of the touch control electrode blocks; and
   a plurality of compensation signal lines, wherein each of the compensation signal lines is connected to one of the compensation switches and one of the touch control electrode blocks;
   wherein each of the touch control electrode blocks is connected to the first touch control switches by the first signal lines and is connected to the compensation switches by the compensation signal lines;

wherein the compensation switches comprise a plurality of second touch control switches and a plurality of third touch control switches, and the compensation signal lines comprise a plurality of second signal lines and a plurality of third signal lines;

wherein the second touch control switches and the third touch control switches are respectively disposed on two opposite sides of the display area; each of the second signal lines is connected to one of the second touch control switches and one of the touch control electrode blocks; and each of the third signal lines is connected to one of the third touch control switches and one of the touch control electrode blocks.

2. The touch control display substrate of claim 1, wherein each of the touch control electrode blocks is connected to one of the first signal lines and one of the second signal lines; or each of the touch control electrode blocks is connected to one of the first signal lines and one of the third signal lines.

3. The touch control display substrate of claim 1, wherein the first touch control switches are spaced apart from each other along the first direction, and the compensation switches are spaced apart from each other along the second direction.

4. The touch control display substrate of claim 1, wherein in the touch control electrode blocks in a same row, the touch control electrode blocks are correspondingly connected to the second touch control switches by the second signal lines when a first distance is greater than a second distance; and the touch control electrode blocks are correspondingly connected to the third touch control switches by the third signal lines when the second distance is greater than the first distance;

wherein the first distance is from the touch control electrode blocks to the second touch control switches along the first direction, and the second distance is from the touch control electrode blocks to the third touch control switches along the first direction.

5. The touch control display substrate of claim 1, wherein a working stage of the touch control display substrate comprises a display stage and a touch control stage, and the touch control electrode blocks are multiplexed as a common electrode in the display stage.

6. The touch control display substrate of claim 1, further comprising:

a plurality of first through-holes defined on the touch control electrode blocks connected to the first signal lines, wherein the first signal lines are correspondingly and electrically connected to the corresponding touch control electrode blocks by the first through-holes; and a plurality of second through-holes defined on the touch control electrode blocks connected to the second signal lines, wherein the second signal lines are correspondingly and electrically connected to the touch control electrode blocks by the second through-holes.

7. The touch control display substrate of claim 6, further comprising:

a plurality of third through-holes defined on the touch control electrode blocks connected to the third signal lines, wherein the third signal lines are correspondingly and electrically connected to the touch control electrode blocks by the third through-holes.

8. The touch control display substrate of claim 6, further comprising:

a first metal layer disposed on the substrate, wherein the second signal lines are disposed in the first metal layer;

a second metal layer disposed on the first metal layer, wherein at least part of the second metal layer is conductive to the first metal layer;

a first insulating layer disposed on the second metal layer, wherein the second through-holes are defined on the first insulating layer; and a touch control electrode layer disposed on the first insulating layer, wherein the touch control electrode blocks are disposed in the touch control electrode layer, and the second metal layer is connected to one of the touch control electrode blocks by the second through-holes.

9. The touch control display substrate of claim 8, further comprising:

a third metal layer disposed below the touch control electrode layer, wherein the first signal lines are disposed in the third metal layer; and a second insulating layer disposed between the second metal layer and the third metal layer.

10. The touch control display substrate of claim 8, further comprising:

an active layer disposed on the substrate;

a gate layer disposed on the active layer, wherein the gate layer and the first metal layer are disposed on a same layer; and a source/drain electrode layer disposed on the gate layer, wherein the source/drain electrode layer and the second metal layer are disposed on a same layer, and the source/drain electrode layer is connected to the active layer.

11. The touch control display substrate of claim 10, further comprising:

a passivation layer disposed on the touch control electrode layer; and a pixel electrode layer disposed on the passivation layer, wherein the pixel electrode layer is partly connected to the source/drain electrode layer.

12. The touch control display substrate of claim 1, wherein each of the first signal lines extends along the second direction and penetrates an entire column of the touch control electrode blocks, and the first signal lines are spaced apart from each other along the first direction; and each of the second signal lines extends along the first direction and penetrates at least one of the touch control electrode blocks in a same row, and the second signal lines are spaced apart from each other along the second direction.

13. The touch control display substrate of claim 12, wherein each of the third signal lines corresponding to the second signal lines extends along the first direction and penetrates other touch control electrode blocks in the same row, and the third signal lines are spaced apart from each other along the second direction.

14. A touch control display panel, comprising a color filter substrate, a liquid crystal layer, and a touch control display substrate, wherein the liquid crystal layer is disposed between the color filter substrate and the touch control display substrate, and the touch control display substrate comprises:

a substrate provided with a display area;

a plurality of touch control electrode blocks disposed in the display area;

a plurality of first touch control switches disposed on the substrate along a first direction;

a plurality of compensation switches disposed on the substrate along a second direction, wherein the first direction intersects the second direction, and the first touch control switches and the compensation switches are disposed on different sides of the touch control electrode blocks;

a plurality of first signal lines, wherein each of the first signal lines is connected to one of the first touch control switches and one of the touch control electrode blocks; and a plurality of compensation signal lines, wherein each of the compensation signal lines is connected to one of the compensation switches and one of the touch control electrode blocks;

wherein each of the touch control electrode blocks is connected to the first touch control switches by the first signal lines, and is connected to the compensation switches by the compensation signal lines;

wherein the compensation switches comprise a plurality of second touch control switches and a plurality of third touch control switches, and the compensation signal lines comprise a plurality of second signal lines and a plurality of third signal lines;

wherein the second touch control switches and the third touch control switches are respectively disposed on two opposite sides of the display area; each of the second signal lines is connected to one of the second touch control switches and one of the touch control electrode blocks; and each of the third signal lines is connected to one of the third touch control switches and one of the touch control electrode blocks.

15. A touch control display device, comprising the touch control display panel of claim 14.

16. The touch control display panel of claim 14, wherein each of the touch control electrode blocks is connected to one of the first signal lines and one of the second signal lines; or each of the touch control electrode blocks is connected to one of the first signal lines and one of the third signal lines.

17. The touch control display panel of claim 14, wherein the first touch control switches are spaced apart from each other along the first direction, and the compensation switches are spaced apart from each other along the second direction.

18. The touch control display panel of claim 14, wherein each of the first signal lines extends along the second direction and penetrates an entire column of the touch control electrode blocks, and the first signal lines are spaced apart from each other along the first direction; and each of the second signal lines extends along the first direction and penetrates at least one of the touch control electrode blocks in a same row, and the second signal lines are spaced apart from each other along the second direction.

19. The touch control display panel of claim 14, wherein the touch control display substrate further comprises:

a plurality of first through-holes defined on the touch control electrode blocks connected to the first signal lines, wherein the first signal lines are correspondingly and electrically connected to the corresponding touch control electrode blocks by the first through-holes; and a plurality of second through-holes defined on the touch control electrode blocks connected to the second signal lines, wherein the second signal lines are correspondingly and electrically connected to the touch control electrode blocks by the second through-holes.

20. The touch control display panel of claim 19, wherein the touch control display substrate further comprises:

a plurality of third through-holes defined on the touch control electrode blocks connected to the third signal lines, wherein the third signal lines are correspondingly and electrically connected to the touch control electrode blocks by the third through-holes.

* * * * *